US008553331B2

(12) United States Patent
Stack et al.

(10) Patent No.: US 8,553,331 B2
(45) Date of Patent: Oct. 8, 2013

(54) SELECTIVE DIFFRACTIVE OPTICAL ELEMENT AND A SYSTEM INCLUDING THE SAME

(75) Inventors: Jared Stack, Charlotte, NC (US); Alan Kathman, Charlotte, NC (US)

(73) Assignee: Flir Systems, Inc., Wilsonville, OR (US)

(*) Notice: Subject to any disclaimer, the term of this patent is extended or adjusted under 35 U.S.C. 154(b) by 780 days.

(21) Appl. No.: 12/654,316

(22) Filed: Dec. 16, 2009

(65) Prior Publication Data

US 2011/0141567 A1      Jun. 16, 2011

(51) Int. Cl.
*G02B 5/18* (2006.01)

(52) U.S. Cl.
USPC ........................................................ 359/569

(58) Field of Classification Search
USPC .......... 359/15, 562, 566, 569; 355/53, 67–71
See application file for complete search history.

(56) References Cited

U.S. PATENT DOCUMENTS

| 5,502,707 A | 3/1996 | Komma et al. |
| 5,774,239 A | 6/1998 | Feldman et al. |
| 2009/0225423 A1 | 9/2009 | Lee et al. |
| 2010/0129742 A1* | 5/2010 | De Winter et al. .............. 430/30 |

FOREIGN PATENT DOCUMENTS

| WO | WO 2006/026593 A2 | 3/2006 |
| WO | WO 2008/131928 A1 | 11/2008 |
| WO | WO 2008/138156 A1 | 11/2008 |

OTHER PUBLICATIONS

International Search Report in PCT/US2010/058897, dated Mar. 7, 2011 (Stack, et al.), European Search Report from prosecution of corresponding European application.

* cited by examiner

*Primary Examiner* — Alessandro Amari
(74) *Attorney, Agent, or Firm* — Lee & Morse, P.C.

(57) ABSTRACT

A selective diffractive optical element includes a first diffractive region having a first design on a first surface of a substrate, and a second diffractive region having a second design on the first surface of the substrate, the first and second designs being different, wherein, by altering a position of a cross-section of an illumination beam, the selective diffractive optical element outputs a desired proportion of the two diffractive patterns aligned along an optical axis of the illumination beam.

24 Claims, 14 Drawing Sheets

(a)
Ab design:

(b)
Bb design:

(C)
Proportions of Ab And Bb adjusted to achieve balance.

(e)

(f)

(g)

(e)

(f)

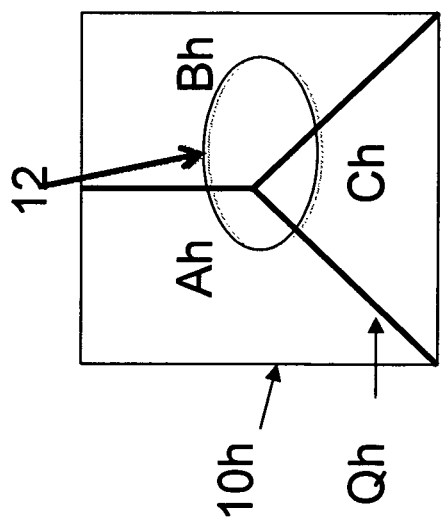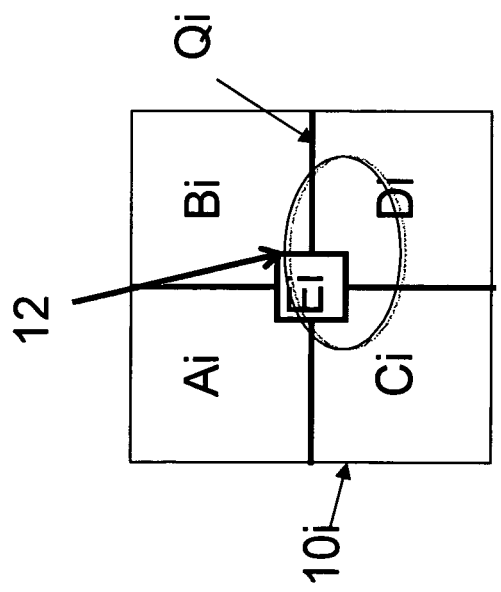
FIG. 9
FIG. 10

(a)

(b)

(c)

(d)

SELECTIVE DIFFRACTIVE OPTICAL ELEMENT AND A SYSTEM INCLUDING THE SAME

BACKGROUND OF THE INVENTION

1. Field of the Invention

Embodiments relate to a selective diffractive optical element and a system including the same.

2. Description of the Related Art

Ultra high performance diffractive optical elements (DOEs) have fabrication tolerances that can affect yield. In particular, performance metrics, e.g., zero order, pole balance, intensity distribution, etc., are highly sensitive to any fabrication variation and require precise control. Typically, existing solutions associated with creating a DOE with ultra high performance metrics, e.g., no zero order, perfect pole balance, precise pole intensity distribution, require dialing in a process window during the manufacture of the DOE and/or selecting from yielded DOEs a subset of parts that meet performance specifications. However, dialing in process windows to provide ultra high performance requires a matrix of varied parts, time, proper measurement and assessment, and high performance tooling. Further, selecting yielded parts to obtain ultra high performance DOEs can be expensive, wasteful, and may not guarantee repeated success.

Additionally, a DOE may be a component in a system having other optical components that degrade over time or having optical requirements that change over time, but designing a new DOE and/or replacing the DOE may not be desirable.

SUMMARY OF THE INVENTION

Embodiments are therefore directed to a DOE and a system including the same that substantially overcome one or more of the disadvantages of the related art.

It is therefore a feature of an embodiment to use of multiple complementary diffractive regions in a DOE to compensate for performance degradations.

It is another feature of an embodiment to provide a DOE with diffractive regions having similar or different optical functionalities that can be individually selected or combined due to a change in transverse positioning of an illumination beam.

It is yet another feature of an embodiment to provide a DOE that is segmented in a manner that allows for selective adjustments of optical performance, e.g., tuning or different optical functioning, due to a change in transverse positioning of an illumination beam.

At least one of the above and other features may be realized by providing a selective diffractive optical element including a first diffractive region having a first design on a first surface of a substrate, and a second diffractive region having a second design on the first surface of the substrate, the first and second designs being different, wherein, by altering a position of a cross-section of an illumination beam, the selective diffractive optical element outputs a desired proportion of the two diffractive patterns aligned along an optical axis of the illumination beam.

The first and second designs may be complementary respective to a desired output of the selective diffractive optical element, e.g., may be complementary with respect to pole intensities, with respect to zero order diffraction, and/or with respect to pole shape.

The first and second diffractive regions may directly abut, may directly above along an extent thereof, or may abut through a blended diffractive region. The first and second diffractive regions may be separated along at least one of a first transverse direction and a second transverse direction. The first and second diffractive regions are equal in size.

The desired proportion may be a combination of the two diffractive patterns. The first diffractive region may create a first dipole and the second diffractive region may create a second dipole, orthogonal to the first dipole. The first diffractive region may create a dipole and the second diffractive region may create a quadrupole.

The selective diffractive optical element may include a third diffractive region having a third design on the first surface of the substrate, the third design being different from the first and second designs. The selective diffractive optical element may include a fourth diffractive region having a fourth design on the first surface of the substrate, the fourth design being different from the first to third designs. First and second regions may be separated from each other along a first transverse direction, third and fourth regions may be separated from each other along the first transverse direction, and the first and second regions may be separated from the third and fourth regions along a second transverse direction, orthogonal to the first transverse direction. The first and second designs may be complementary and the third and fourth designs may be complementary. The first to fourth designs may each create a monopole. The first and second designs may each create a first dipole and the third and fourth designs may each create a second dipole, orthogonal to the first dipole. The selective diffractive optical element may include a fifth diffractive region having a fifth design on the first surface of the substrate, the fifth design being different from the first to fourth designs, the fifth diffractive region being at an intersection of the first to fourth diffractive regions. The first to fourth regions may be separated from adjacent regions along a first transverse direction.

At least one of the above and other features and advantages may be realized by providing an optical system, including a light source adapted to output an illumination beam, and a selective diffractive optical element adapted to receive the illumination beam. The selective diffractive optical element includes a first diffractive region having a first design on a first surface of a substrate, and a second diffractive region having a second design on the first surface of the substrate, the first and second designs being different, wherein, by altering a position of a cross-section of the illumination beam to illuminate the first and second diffractive regions, the selective diffractive optical element outputs a desired proportion of the two diffractive patterns aligned along an optical axis of the illumination beam.

The desired proportion may be a combination of the two diffractive patterns. The optical system may be an illumination system in a lithography system. The light source may be a single light source. The optical system may include an actuator adapted to move the illumination beam relative to the selective diffractive optical element along at least one of a first transverse direction and a second transverse direction.

At least one of the above and other features and advantages may be realized by providing a selective diffractive optical element, including a first diffractive region having a first design on a first surface of a substrate, and a second diffractive region having a second design on the first surface of the substrate, the first and second designs being complementary respective to a desired output of the selective diffractive optical element.

BRIEF DESCRIPTION OF THE DRAWINGS

The above and other features and advantages will become more apparent to those of ordinary skill in the art by describing in detail exemplary embodiments with reference to the attached drawings, in which:

FIGS. 2 to 11 illustrate designs of a selective DOE and outputs thereof in accordance with embodiments.

DETAILED DESCRIPTION

Embodiments will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions may be exaggerated for clarity of illustration.

Figure 1:
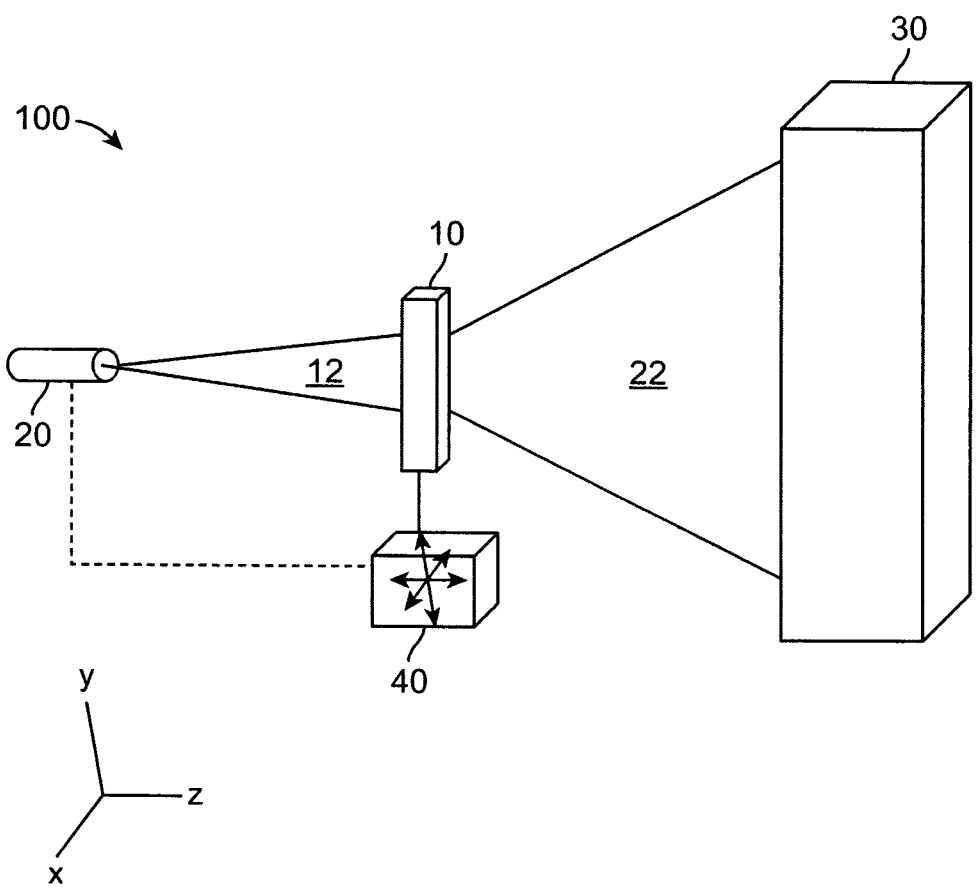
FIG. 1 illustrates a schematic, perspective view of a system using a selective DOE in accordance with embodiments.

FIG. 1 illustrates a schematic perspective view of a system 100 including a selective DOE 10 in accordance with embodiments. The system 100 may include a light source 20, the selective DOE 10, and a target 30. The target 30 may be internal to or external to the system 100. The target 30 is illuminated by the DOE 10. At least one of the light source 20, the selective DOE 10, and the target 30 may be movable relative to the other components. The light source 20 may be a single light source and may output a single beam or may have traversed an optical element, e.g., a fly's eye lens, to create multiple beams from the single light source. For ease of explanation, only a minimal number of elements have been illustrated. However, the selective DOE 10 may be employed as part of a more complex optical system, including lenses, beamshapers, stops, and so forth.

As illustrated in FIG. 1, the system 100 may include an actuator 40 configured to move the selective DOE 10 along any of the x, y, and z directions relative to the light source 20. While the actuator 40 is indicated as being coupled to the selective DOE 10, additionally or alternatively, the actuator 40 may be coupled to the light source 20, as indicated by the dashed lines. Movement in the z direction, i.e., the optical axis, will alter the size of a beam 12 from the light source 20 incident on the selective DOE 10. As discussed in detail below with reference to FIGS. 2 to 11, the selective DOE 10 may include adjacent regions, e.g., abutting regions, having different diffractive patterns, such that movement in the x and/or y direction (i.e., transverse to the direction of the optical axis Z) will alter a position of a cross-section of the beam 12 on the selective DOE 10 which may alter a beam 22 output by the selective DOE 10, while not resulting in misalignment in the z direction.

Thus, a transverse position of the selective DOE 10 according to embodiments may be altered relative to the beam 12 to alter the beam 22 output from the selective DOE 10. For example, the selective DOE 10 may be precisely adjusted such that ultra high performance is obtained. Additionally or alternatively, the selective DOE 10 may be designed to create various outputs of similar or different functionality, and still allow for fine tuning within each output zone. Once properly tuned, the selective DOE 10 may be fixedly secured.

The selective DOE 10 is less sensitive to fabrication tolerances. Accordingly, designs according to embodiments may be successfully implemented with regions having various imperfections. Each region may vary widely from an ideal region, and such variation may be compensated by tuning of the selective DOE 10 to adjust the overall performance. In contrast to lenses or beamshapers, transverse motion of the selective DOE 10 will not misalign the optical axis of the illumination beam. For example, tuning may be accomplished using complementary diffractive regions and moving the selective DOE 10 with respect to the illumination beam. Further, such transverse movement may provide precise control of specific performance parameters, allow the selective DOE 10 to be adjusted to compensate for other parameters of the optical system, and provide ultra-high performance overall that may not be practical with a DOE having a single design thereon.

Detailed exemplary designs of the selective DOE 10 are illustrated in FIGS. 2 to 11. In general, a selective DOE 10 according to embodiments includes two or more regions on a surface of a planar substrate. These regions correspond to specific optical functions. Multiple regions allow for the use of complementary optical techniques, such as constructive or destructive interference and/or superposition, to create intensity variations in the output pupil plane. The illuminated area of a region will create a proportional contribution in the output plane of the selective DOE 10. These regions may be separated by an abrupt discontinuity, e.g., a line in either the x or y direction, or may have a blended discontinuity, where some average of adjacent regions may provide a transition therebetween.

Figure 2:
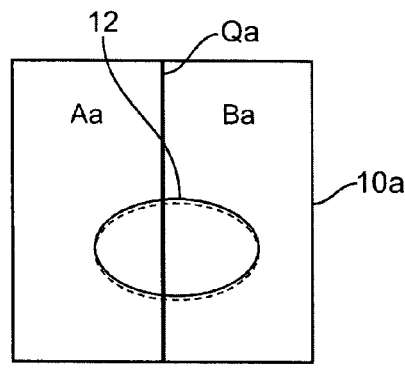
Figure 2:
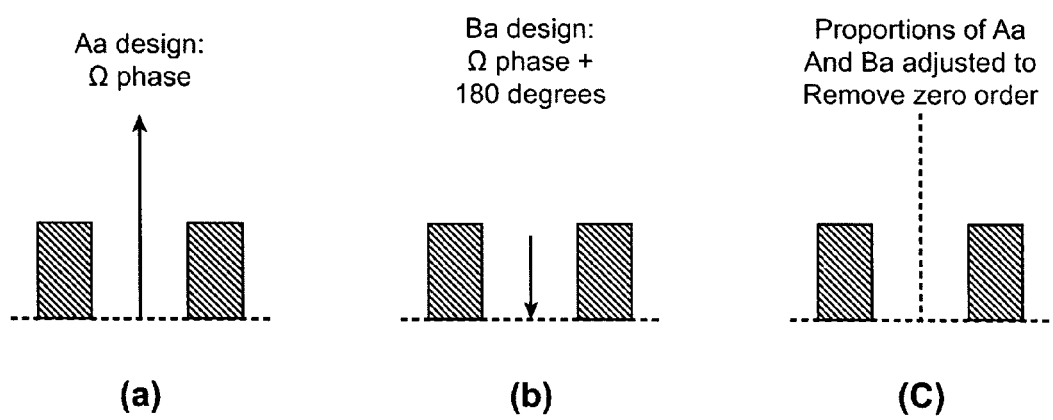

As illustrated in FIG. 2, a selective DOE 10a may include two distinct side-by-side regions Aa and Ba separated by an abrupt discontinuity Qa. In the particular example of FIG. 2, undesired zero order of complementary phases is intentionally introduced into designs for both regions Aa and Ba, as illustrated in FIGS. 2(a) and 2(b). These regions Aa and Ba can be illuminated by light beam 12 in the correct proportion such that zero order light is removed from the beam 22 output by the selective DOE 10a, illustrated in FIG. 2(c). In this example, the appropriate proportion is attained through a transverse shift of the selective DOE 10a relative to the light beam 12. In this specific example, relative amplitudes of the zero order of the designs for the regions Aa and Ba may be arbitrary, but the relative phases of the zero orders should be complementary, e.g., separated by 180° when there are two regions, more generally by 360°/n when there are n regions.

Figure 3:
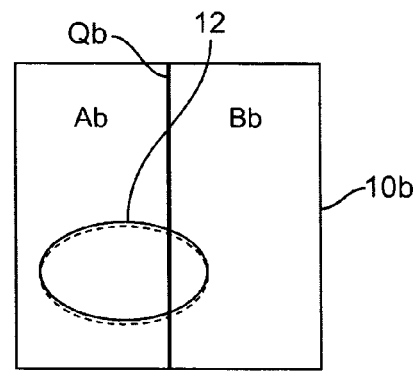
Figure 3:
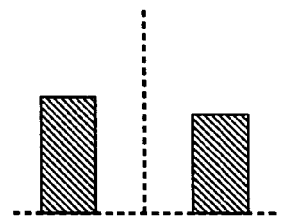
Figure 3:
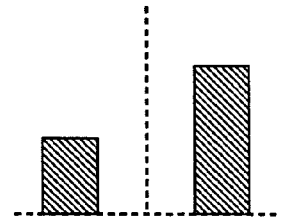
Figure 3:
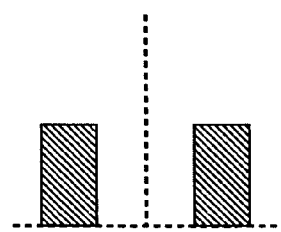

As illustrated in FIG. 3, a selective DOE 10b may include two distinct side-by-side regions Ab and Bb separated by an abrupt discontinuity Qb. In the particular example of FIG. 3, pole balance may be achieved by intentionally introducing pole imbalance into designs for both regions Ab and Bb, as illustrated in FIGS. 3(a) and 3(b). Then, as illustrated in FIG. 3(c), the poles are balanced in the beam 22 output by the selective DOE 10a by illuminating regions Ab and Bb with the correct proportion of light beam 12. In this specific example, relative pole balance of the designs for the regions Ab and Bb may be arbitrary, but should be complementary, i.e., in opposing directions.

Figure 4:
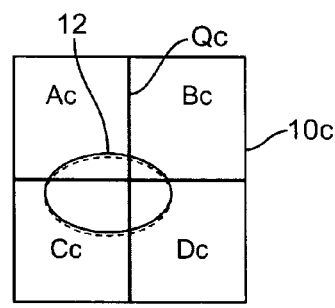
Figure 4:
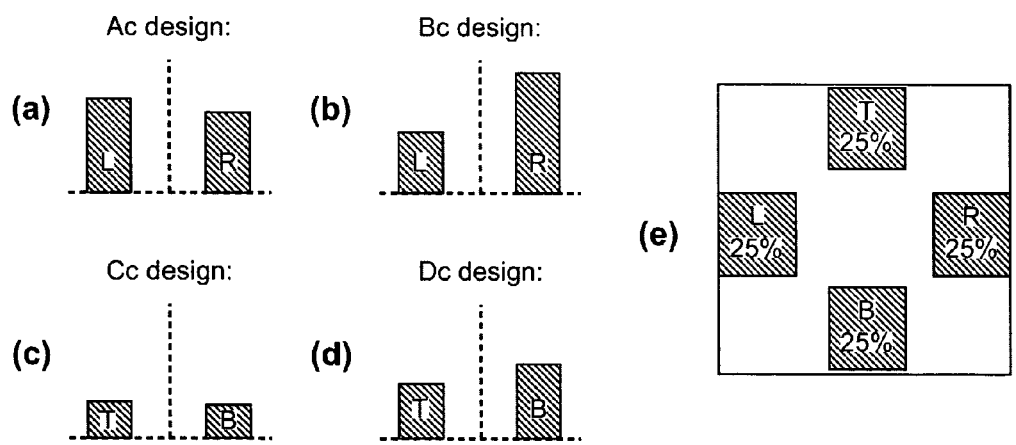
Figure 4:
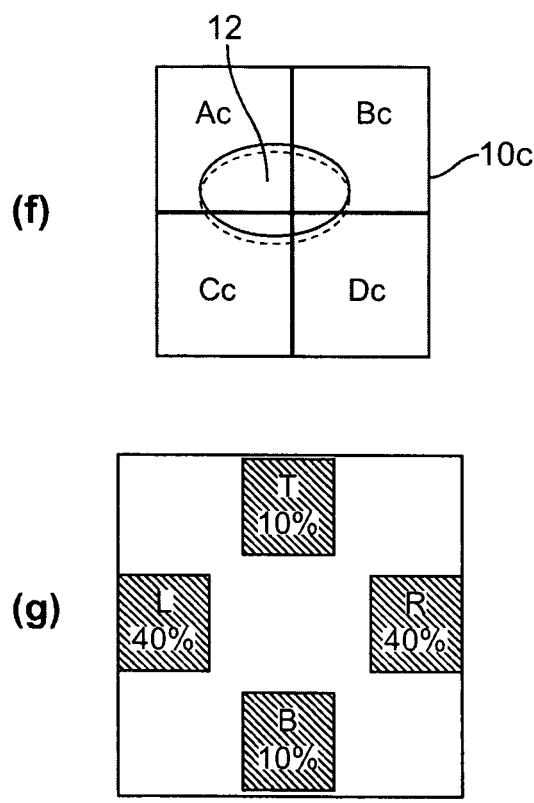

A selective DOE 10c may include more than two regions. FIG. 4 depicts a selective DOE 10c having four quadrants Ac, Bc, Cc, and Dc, all separated by an abrupt transition Qc. In the particular example of FIG. 4, crossed dipoles are used, with regions Ac and Bc providing left and right dipoles, both having pole imbalances, as illustrated in FIGS. 4(a) and 4(b), and regions Cc and Dc providing top and bottom dipoles, both having pole imbalances, as illustrated in FIGS. 4(c) and 4(d).

The relative pole imbalances associated with regions Ac, Bc and Cc, Dc may be arbitrary, but should be complementary, i.e., in opposing directions. Likewise, regions Ac, Cc and Bc, Dc should have similar pole offset directions and proportions. The relative power balance of Ac, Bc vs. Cc, Dc may be varied arbitrarily to create different intensities associated with each axis. As illustrated in FIG. 4(e), the dipoles may be balanced with the light beam 12 positioned as shown at the top of FIG. 4. As illustrated in FIGS. 4(f) to 4(g), by moving the location of the beam 12 on the selective DOE 10c, different dipole balance may be achieved, i.e., a dipole imbalance. For example, as illustrated in FIG. 4(f), left and right dipoles and top and bottom dipoles may be balanced with respect to one another, but imbalanced between the left-right and top-bottom dipole pairs.

Figure 5:
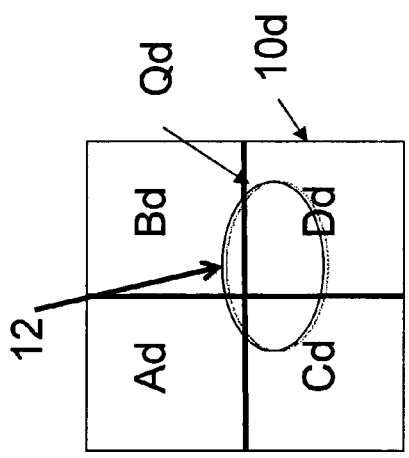
Figure 5:
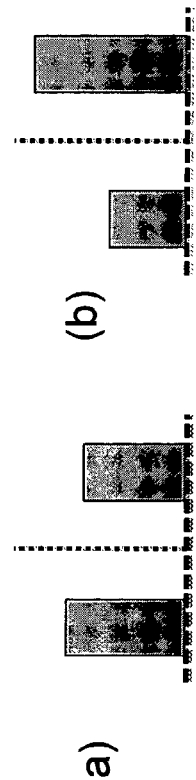
Figure 5:
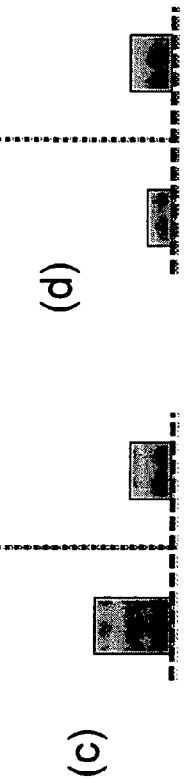
Figure 5:
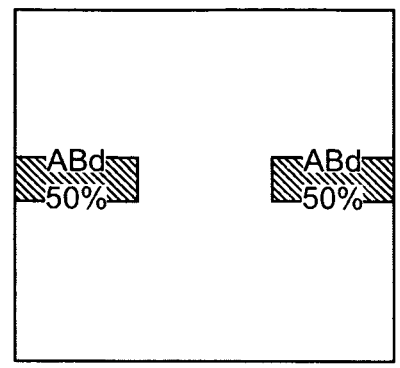
Figure 5:
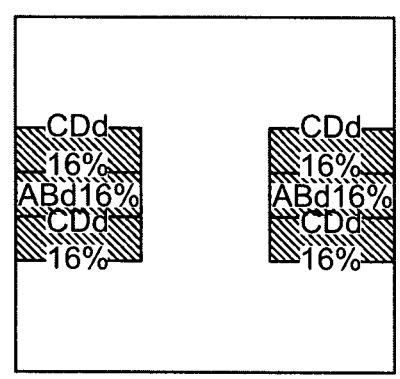
Figure 5:
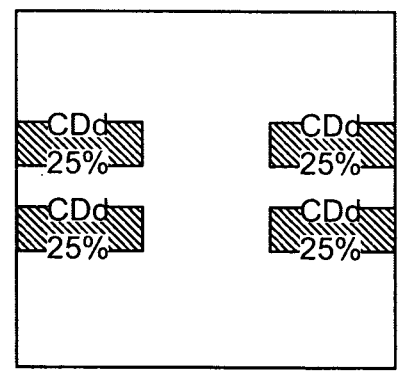

As illustrated in FIG. 5, a selective DOE 10d including cross dipoles may be designed to adjust pole widths. The selective DOE 10d may include a quadrant having four regions Ad, Bd, Cd, and Dd, all separated by an abrupt transition Qd. In the particular example of FIG. 5, crossed dipoles are used, with regions Ad and Bd providing left and right dipoles, both having pole imbalances, as illustrated in FIGS. 5(a) and 5(b), and regions Cd and Dd also providing right and left dipoles, both having pole imbalances, as illustrated in FIGS. 5(c) and 5(d). The relative pole imbalances associated with regions Ad, Bd and Cd, Dd may be arbitrary, but should be complementary, i.e., in opposing directions. The relative power balance of Ad, Bd vs. Cd, Dd may be varied arbitrarily to create different intensities associated with each pair. Different designs can be individually selected as well.

As illustrated in FIGS. 5(e) to (g), depending on the location of the beam 12, output of the selective DOE 10d may be altered. For example, when the beam 12 is only incident on the upper half of the selective DOE 10d, the selective DOE 10d may output a narrow, balanced dipole, as illustrated in FIG. 5(e). When the beam 12 is incident on all quadrants of the selective DOE 10d, the selective DOE 10d may output a wide, balanced dipole, as illustrated in FIG. 5(f). When the beam 12 is only incident on the lower half of the selective DOE 10d, the selective DOE 10d may output a balanced quadrupole, as illustrated in FIG. 5(g).

Figure 6:
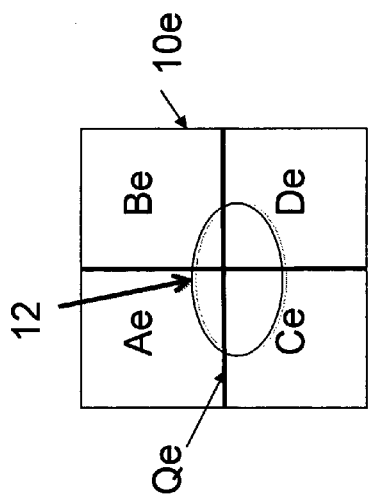
Figure 6:
Figure 6:
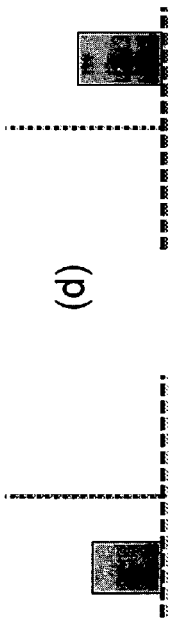
Figure 6:
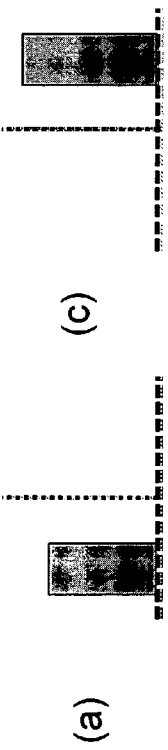
Figure 6:
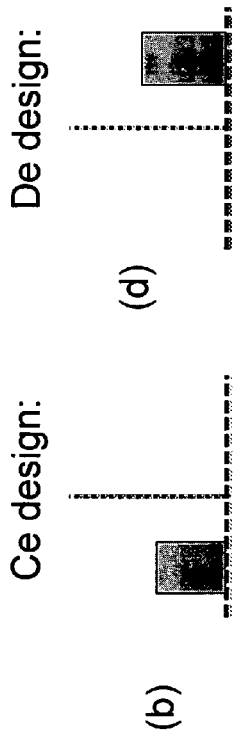
Figure 6:
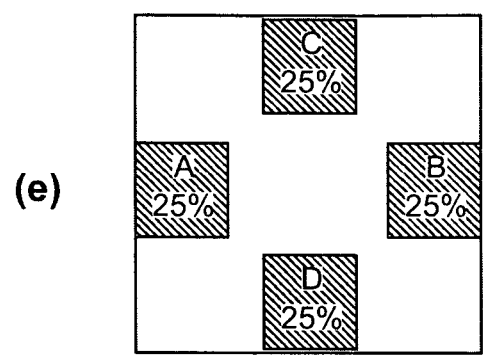
Figure 6:
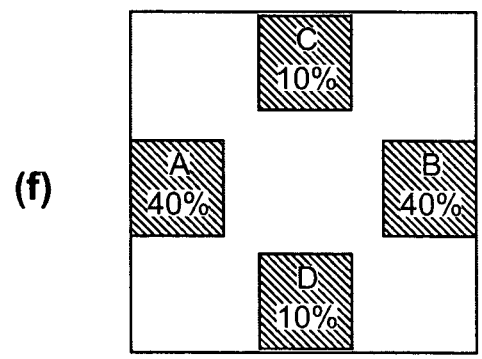

As illustrated in FIG. 6, a selective DOE 10e may include monopoles designed to adjust pole intensity. In particular, the selective DOE 10e may include four regions Ae, Be, Ce, and De, all separated by an abrupt transition Qe between the regions. The relative pole intensities associated with the regions Ae, Be, Ce, and De may be discrete, as illustrated in FIGS. 6(a) to 6(d). In terms of relative intensity, A:B=C:D. The relative power balance of Ae, Be vs. Ce, De may be varied arbitrarily to create different intensities associated with each axis, as illustrated in FIGS. 6(e) and 6(f). The different designs are not limited to monopoles, but could represent entire full field patterns.

Figure 7:
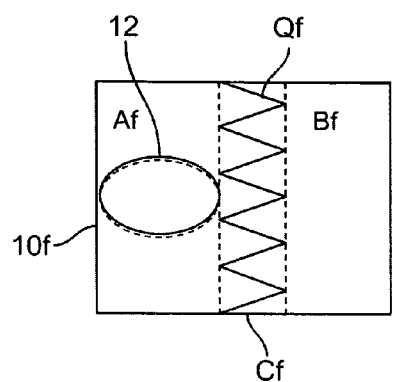
Figure 7:
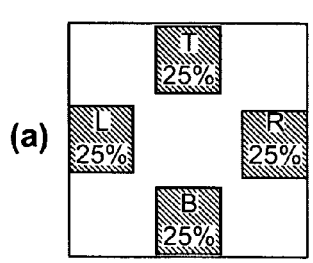
Figure 7:
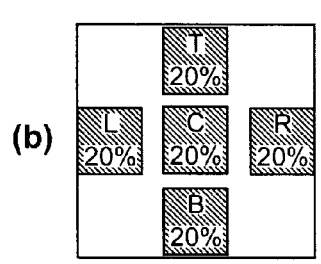
Figure 7:
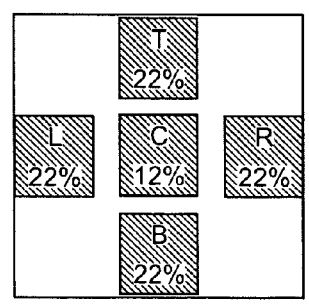

As illustrated in FIG. 7, a selective DOE 10f may include two regions Af and Bf that output crossed dipoles. These regions Af and Bf may be separated by an irregular discrete boundary Qf, such that a region Cf is formed having components of both the regions Af and Bf. The size of the region Cf may be determined by the size of the beam 12. When the beam 12 is fully in a single region Af or Bf, the output of the selective DOE 10f will be that of the Af and Bf designs, e.g., as illustrated in FIGS. 7(a) and 7(b). When the beam 12 is in the blended region Cf, the output of the selective DOE 10f may be as illustrated in FIG. 7(c).

Figure 8:
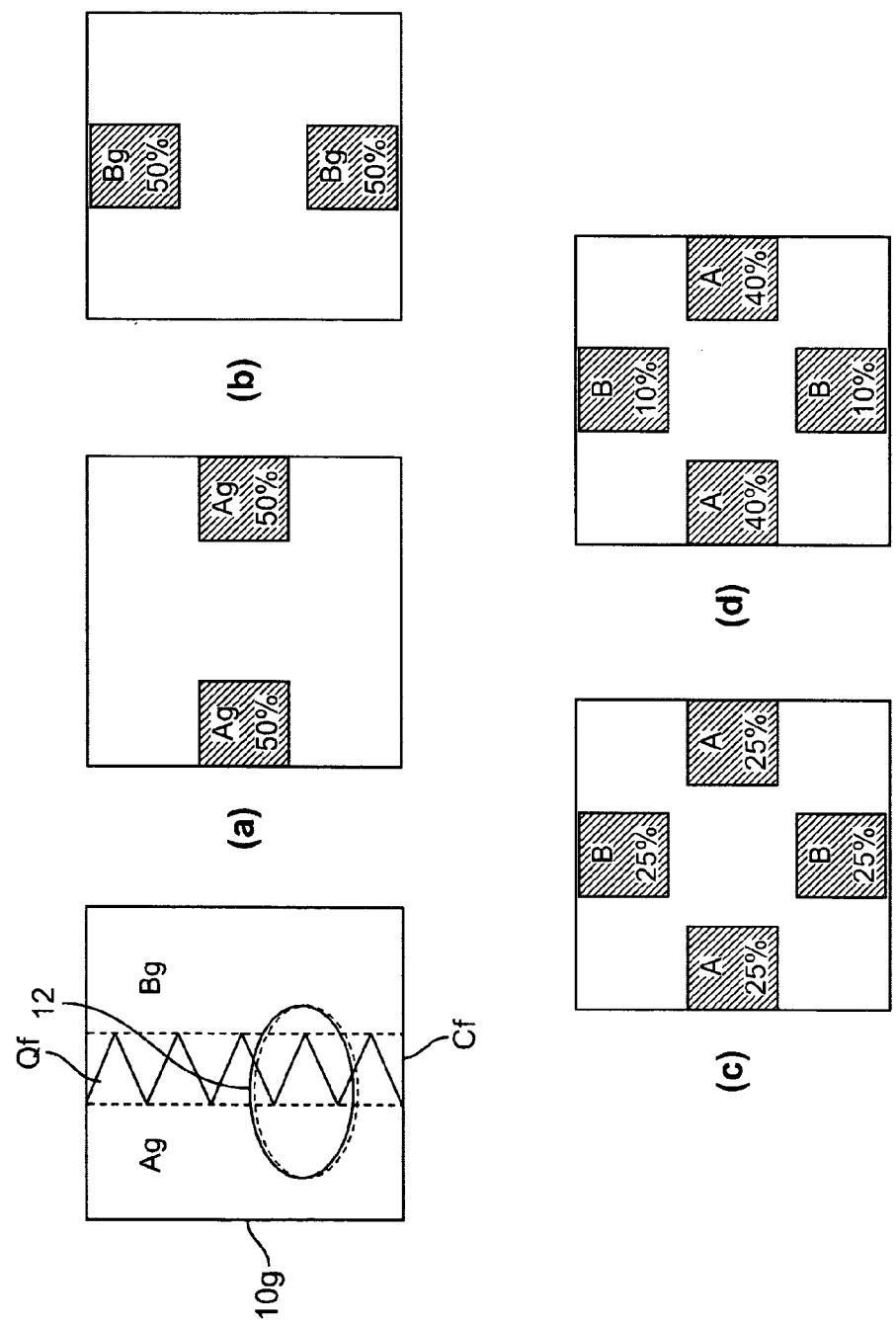

As illustrated in FIG. 8, a selective DOE 10g may include two regions Ag and Bg that output crossed dipoles. These regions Ag and Bg may be separated by an irregular discrete boundary Qg, such that a region Cg is formed having components of both the regions Ag and Bg. The size of the region Cg may be determined by the size of the beam 12. When the beam 12 is fully in a single region Ag or Bg, the output of the selective DOE 10g will be that of the Ag and Bg designs, e.g., as illustrated in FIGS. 8(a) and 8(b). When part of the beam 12 illuminates the blended region Cg, the output of the selective DOE 10f may be tuned to distribute equal amounts of power into all four poles, as illustrated in FIG. 8(c), or to distribute different amounts of power in the orthogonal dipoles, as illustrated in FIG. 8(d).

Figure 11:
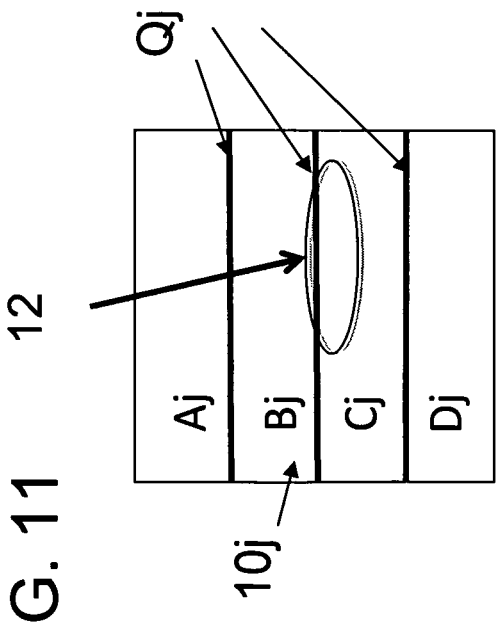
Figure 11:
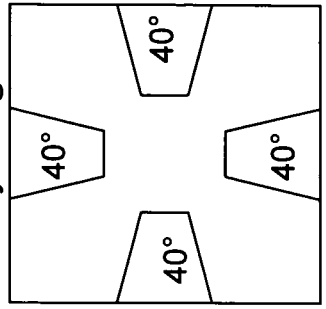
Figure 11:
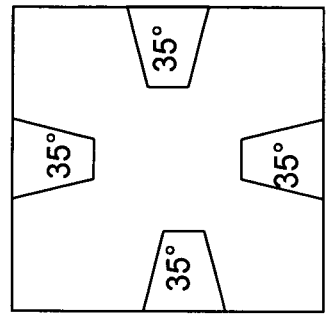
Figure 11:
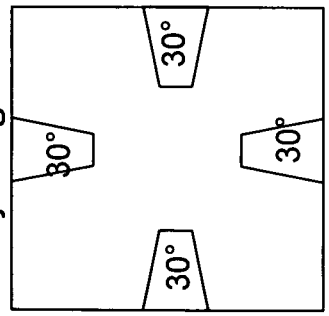
Figure 11:
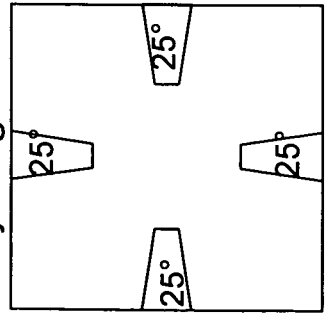

FIGS. 9 to 11 illustrated configurations for pattern regions in accordance with embodiments other than the quadrant and halve configurations discussed above. As illustrated in FIG. 9, a selective DOE 10h may include pattern regions Ah, Bh, and Ch, having unequal areas. In this particular example, the region Ch is an equilateral triangle and regions Ah, Bh, evenly complete the square of the selective DOE 10h. In another embodiment, the selective DOE 10h may have regions Ah, Bh, and Ch subtending substantially similar angles (e.g., around 120°). As illustrated in FIG. 10, a selective DOE 10i may include four regions Ai, Bi, Ci, Di arranged in a quadrant, with a fifth region Ei at an intersection, e.g., a center, thereof. As illustrated in FIG. 11, a selective DOE 10j may include four regions Aj, Bj, Cj, Dj arranged as a vertical stack.

Use of the selective DOE 10j arranged as a vertical stack may be of particular interest when a pattern having varying pole sizes is to be provided in the different regions. For example, as illustrated in FIG. 11(a), the region Aj may output a quadrupole with 25° poles, the region Bj may output a quadrupole with 30° poles, the region Cj may output a quadrupole with 35° poles, and the region Dj may output a quadrupole with 40° poles. When the illumination beam 12 overlaps more than one region, the pole size may be adjusted proportional to the overlap. Of course, different increments and number of regions may be employed as needed.

Figure 12:
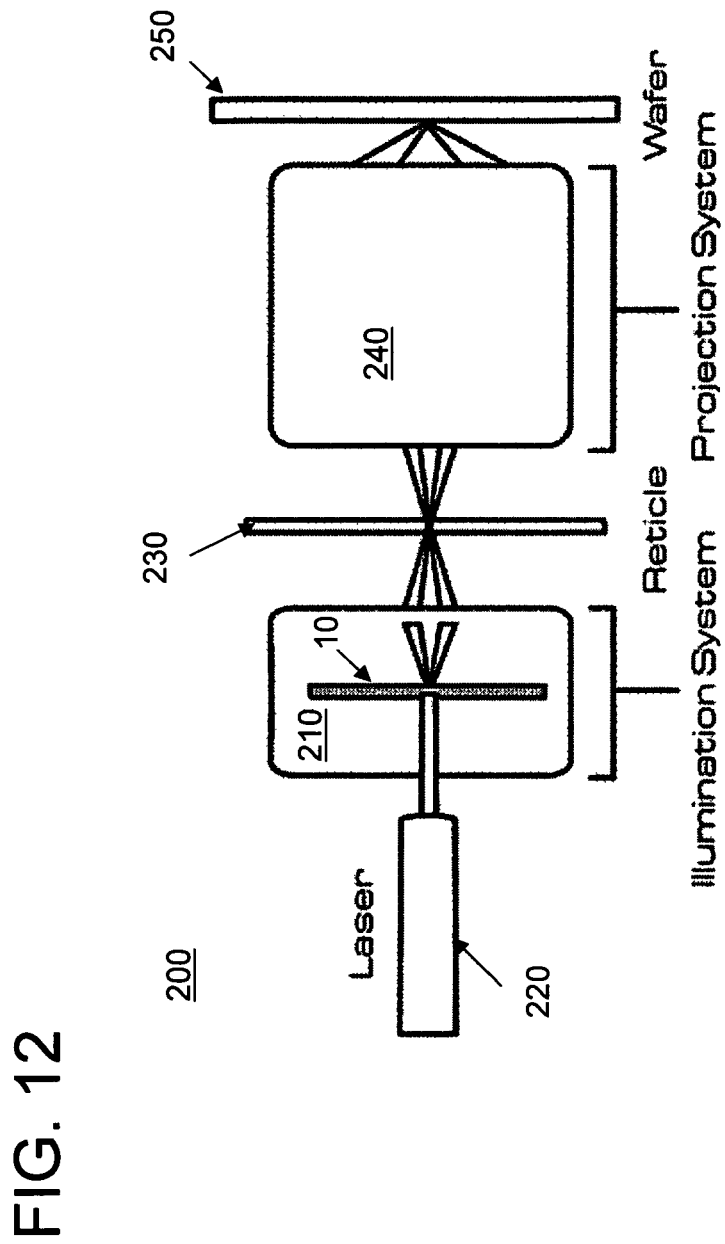
FIG. 12 illustrates a schematic side view of a lithographic system using a selective DOE in accordance with embodiments.

A particular example of a system in which selective DOEs may be employed is a lithography system. FIG. 12 illustrates a schematic side view of a lithography system 200 using the selective DOE 10 in accordance with embodiments. The lithography system 200 may include a laser 220, an illumination system 210, including the selective DOE 10, a reticle 230 (or reticle mount), a projection system 240, and a wafer 250 (or wafer mount) to be lithographically patterned. The illumination system 210 may also include the actuator 40 illustrated in FIG. 1. The selective DOE 10 may be tuned as discussed above in accordance with embodiments for use with a particular laser, a particular reticle, and/or specific pattern to be formed on the wafer.

While the transition between pattern regions have been illustrated above as an abrupt linear transition or a blended region including equal proportions of both patterns, the transition from one pattern region to another could be embodied in a variety of ways. For example, the transition may include chirped strips, halftoned combinations, blends of multiple intermediate designs, etc. Further, while tuning intensity distributions and pole balance has been discussed above, other characteristics of the beam output from a selective DOE may be tuned, e.g., polarization. Further, a selective DOE is not limited to a square.

Thus, in accordance with embodiments, a selective DOE having different diffractive regions along at least one of an x direction and a y direction may allow tuning to compensate for manufacturing errors and/or different functionalities.

Exemplary embodiments of the present invention have been disclosed herein, and although specific terms are employed, they are used and are to be interpreted in a generic and descriptive sense only and not for purpose of limitation. For example, it is to be understood that numerous diffractive regions may be employed in accordance with embodiments, depending on a range of desired outputs. Accordingly, it will be understood by those of ordinary skill in the art that various changes in form and details may be made without departing from the spirit and scope of the present invention as set forth in the following claims.

What is claimed is:

1. A selective diffractive optical element, comprising: a first diffractive region on a first surface of a substrate, the first diffractive region having a first design; and a second diffractive region, separate from the first diffractive region and on the first surface of the substrate, the second diffractive region having a second design, the first and second designs being different, but complementary respective to a desired balanced output of the selective diffractive optical element, wherein, by altering a position of a cross-section of an illumination beam, the selective diffractive optical element outputs a beam having a desired proportion of the first and second diffractive regions aligned along an optical axis of the illumination beam, the desired proportion being realized from a combination of the first and second diffractive regions and, when the position of the cross-section of the illumination beam is in a predetermined region including both the first and second diffractive regions, the output beam is balanced.

2. The selective diffractive optical element as claimed in claim 1, wherein the first and second designs are complementary with respect to pole intensities.

3. The selective diffractive optical element as claimed in claim 1, wherein the first and second designs are complementary with respect to zero order diffraction.

4. The selective diffractive optical element as claimed in claim 1, wherein the first and second designs are complementary with respect to pole shape.

5. The selective diffractive optical element as claimed in claim 1, wherein the first and second diffractive regions directly abut.

6. The selective diffractive optical element as claimed in claim 1, wherein the first and second diffractive regions abut through a blended diffractive region.

7. The selective diffractive optical element as claimed in claim 1, wherein the first and second diffractive regions are separated along one of a first transverse direction and a second transverse direction.

8. The selective diffractive optical element as claimed in claim 1, wherein the first and second diffractive regions are equal in size.

9. The selective diffractive optical element as claimed in claim 1, wherein the desired proportion is an equal combination of the first and second diffractive regions.

10. The selective diffractive optical element as claimed in claim 1, wherein the first diffractive region creates a first dipole and the second diffractive region creates a second dipole, orthogonal to the first dipole.

11. The selective diffractive optical element as claimed in claim 1, wherein the first diffractive region creates a dipole and the second diffractive region creates a quadrupole.

12. The selective diffractive optical element as claimed in claim 1, further comprising a third diffractive region having a third design on the first surface of the substrate, the third design being different from the first and second designs.

13. The selective diffractive optical element as claimed in claim 12, further comprising a fourth diffractive region having a fourth design on the first surface of the substrate, the fourth design being different from the first to third designs.

14. The selective diffractive optical element as claimed in claim 13, wherein first and second regions are separated from each other along a first transverse direction, third and fourth regions are separated from each other along the first transverse direction, and the first and second regions are separated from the third and fourth regions along a second transverse direction, orthogonal to the first transverse direction.

15. The selective diffractive optical element as claimed in claim 14, wherein the third and fourth designs are complementary with respect to a balanced output.

16. The selective diffractive optical element as claimed in claim 15, wherein the first to fourth design each create a monopole.

17. The selective diffractive optical element as claimed in claim 15, wherein the first and second designs each create a first dipole and the third and fourth designs create a second dipole, orthogonal to the first dipole.

18. The selective diffractive optical element as claimed in claim 14, further comprising a fifth diffractive region having a fifth design on the first surface of the substrate, the fifth design being different from the first to fourth designs, the fifth diffractive region being at an intersection of the first to fourth diffractive regions.

19. The optical system as claimed in claim 18, further comprising an actuator adapted to move the illumination beam relative to the selective diffractive optical element along at least one of a first transverse direction and a second transverse direction.

20. The selective diffractive optical element as claimed in claim 13, wherein the first to fourth regions are separated from adjacent regions along a first transverse direction.

21. An optical system, comprising: a light source adapted to output an illumination beam; and a selective diffractive optical element adapted to receive the illumination beam, the selective diffractive optical element including: a first diffractive region on a first surface of a substrate, the first diffractive region having a first design; and a second diffractive region, separate from the first diffractive region and on the first surface of the substrate, the second diffractive region having a second design, the first and second designs being different, but complementary respective to a balanced output of the selective diffractive optical element, wherein, by altering a position of a cross-section of an illumination beam, the selective diffractive optical element outputs a beam having a desired proportion of the first and second diffractive regions aligned along an optical axis of the illumination beam, the desired proportion being realized from a combination of the first and second diffractive regions and, when the position of the cross-section of the illumination beam is in a predetermined region including both the first and second diffractive regions, the output beam is balanced.

22. The optical system as claimed in claim 21, wherein the desired proportion is an equal combination of the first and second diffractive regions.

23. The optical system as claimed in claim 21, wherein the optical system is an illumination system in a lithography system.

24. The optical system as claimed in claim 21, wherein the light source is a single light source.

* * * * *